(12) United States Patent
Chen

(10) Patent No.: US 9,726,840 B2
(45) Date of Patent: Aug. 8, 2017

(54) INTEGRATION OF ELECTRONIC CHIPS ONTO A PHOTONIC CHIP

(71) Applicant: Acacia Communications, Inc., Maynard, MA (US)

(72) Inventor: Long Chen, Marlboro, NJ (US)

(73) Assignee: Acacia Communications, Inc., Maynard, MA (US)

( * ) Notice: Subject to any disclaimer, the term of this patent is extended or adjusted under 35 U.S.C. 154(b) by 154 days.

(21) Appl. No.: 14/298,846

(22) Filed: Jun. 6, 2014

(65) Prior Publication Data

US 2014/0360013 A1    Dec. 11, 2014

Related U.S. Application Data

(60) Provisional application No. 61/832,009, filed on Jun. 6, 2013.

(51) Int. Cl.
*H05K 3/36*   (2006.01)
*G02B 6/42*   (2006.01)

(52) U.S. Cl.
CPC .... *G02B 6/4274* (2013.01); *H01L 2924/0002* (2013.01); *Y10T 29/49126* (2015.01)

(58) Field of Classification Search
CPC ...... G02B 6/43; G02B 6/423; G02B 6/12004; Y10T 29/49126; Y10T 29/49826
USPC ........ 29/830, 832, 836, 846; 385/14, 49, 52, 385/65, 92
See application file for complete search history.

(56) References Cited

U.S. PATENT DOCUMENTS 8,755,655 B2 * 6/2014 Krishnamoorthy ...... G02B 6/12
                                                    385/14

* cited by examiner

*Primary Examiner* — Thiem Phan
(74) *Attorney, Agent, or Firm* — Wolf, Greenfield & Sacks, P.C.

(57) ABSTRACT

Methods, structures, apparatus, devices, and materials to facilitate the integration of electronic integrated circuits (chips) including drivers, amplifiers, microcontrollers, etc., onto/into photonic integrated circuits (chips) using recessed windows exhibiting controlled depths onto/into the photonic chip. The electronic chips are positioned into the recessed windows and electrical connections between the electronic chips and the photonic chip are achieved by flip-chip techniques with predefined traces at a bottom of the recessed windows or direct wire bonding. Advantageously, this integration may be performed on a wafer level for large-volume productions.

16 Claims, 2 Drawing Sheets

INTEGRATION OF ELECTRONIC CHIPS ONTO A PHOTONIC CHIP

CROSS REFERENCE TO RELATED APPLICATIONS

This application claims the benefit of U.S. Provisional Patent Application Ser. No. 61/832,009 filed Jun. 6, 2013 which is incorporated by reference in its entirety as if set forth at length herein.

TECHNICAL FIELD

This disclosure relates generally to electronic and photonic integrated circuits. More particularly, this disclosure pertains to techniques, methods, apparatus, structures and materials for integrating electronic integrated circuits (chips) onto photonic integrated circuits.

BACKGROUND

Contemporary optical communications and other photonic systems oftentimes make extensive use of symbiotic electronic integrated circuits. Accordingly, techniques, methods, apparatus, structures or materials that facilitate the integration of such electronic integrated circuits onto/into photonic integrated circuits would represent a welcome addition to the art.

SUMMARY

An advance in the art is made according to an aspect of the present disclosure directed to techniques, methods, apparatus, structures and materials to integrate electronic integrated circuits (chips) into/onto photonic integrated circuits (chips).

In sharp contrast to prior art integration techniques that oftentimes employed shims of varying thicknesses, the present disclosure is directed to methods, apparatus, structures and materials wherein recessed windows of controlled depths are prepared on the photonic integrated circuit chip and the electronic integrated circuit chip is then positioned in a recessed window so prepared.

BRIEF DESCRIPTION OF THE DRAWING

A more complete understanding of the present disclosure may be realized by reference to the accompanying drawing in which.

DETAILED DESCRIPTION

Figure 1:
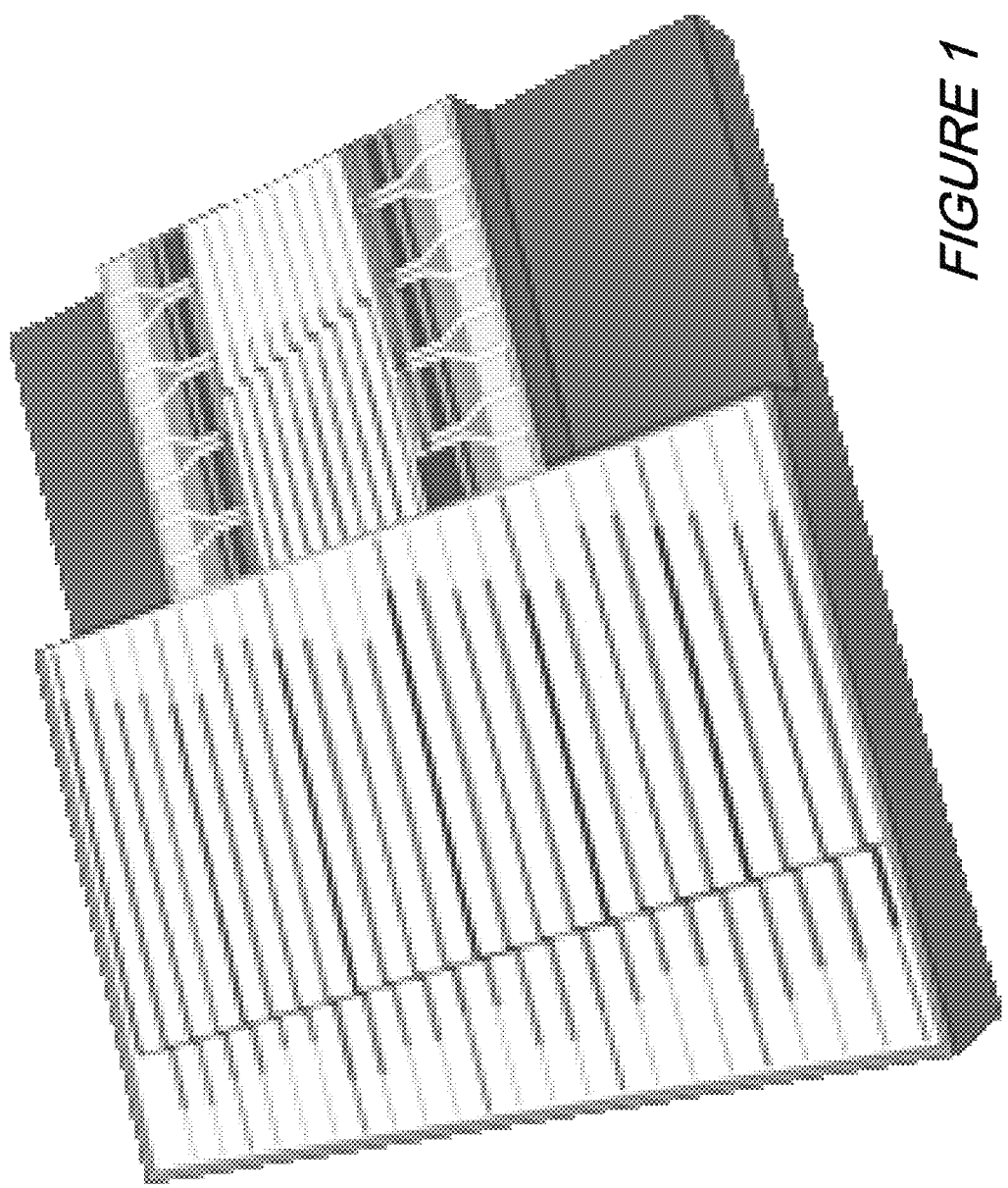
FIG. 1 shows a schematic illustration of an exemplary electronic chip to photonic chip integration before electronic chips are positioned on the photonic chip according to an aspect of the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope. More particularly, while numerous specific details are set forth, it is understood that embodiments of the disclosure may be practiced without these specific details and in other instances, well-known circuits, structures and techniques have not be shown in order not to obscure the understanding of this disclosure.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the disclosure.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

By way of some additional background, we begin by noting that optical modules and systems oftentimes require some integration of electronic circuits and the photonic circuits, for at least the purpose(s) of providing power, controls, and RF signals to and from the photonic circuits.

For example, a typical transceiver module requires driver amplifiers, transimpedance amplifiers, and oftentimes digital-analog converter chips to support their operation. Additionally, as module bandwidth increases and its footprint shrinks, many of the electronic chips need to be located as physically close as possible to the photonic circuits.

For high speed applications, the length of electrical conductors (wiring) between electronic chips and photonic circuits is preferably as short as possible, usually less than 200 um. As may be appreciated, such proximity may require a "height-matching" of the electronic chips to the photonic circuits (chips). Since electronic chips are often manufactured using completely different material systems and technologies (including GaAs, InP, SiGe and Si etc.), they may exhibit very different thicknesses than the photonic circuits—hence height-matching is difficult. Additionally, some electronic chips may require specific electrical and environmental characteristics—for example electrical grounding, heat dissipation, etc. As those skilled in the art will readily appreciate, such characteristics may make the integration process complicated, time-consuming, and costly.

According to a number of prior art approaches, this integration of electronic and photonic chips is accomplished by supplementing a host substrate with multiple shims of varying thicknesses such that the heights (or relevant thickness) of the electronic chip and photonic chips are matched—or sufficiently similar—such that their heights are matched. Any grounding and heat dissipation requirements are then addressed by employing metalized shims and shims exhibiting a sufficiently large thermal conductivity.

As may be immediately realized, this must be done on a chip-to-chip basis and any time and cost for adding these elements to the overall goes up rapidly if multiple chips have to be packaged.

According to an aspect of the present disclosure, recessed windows of controlled heights are prepared on the photonic circuit chip such that the electronic chips dropped (or otherwise positioned) into/onto these windows.

Figure 2:
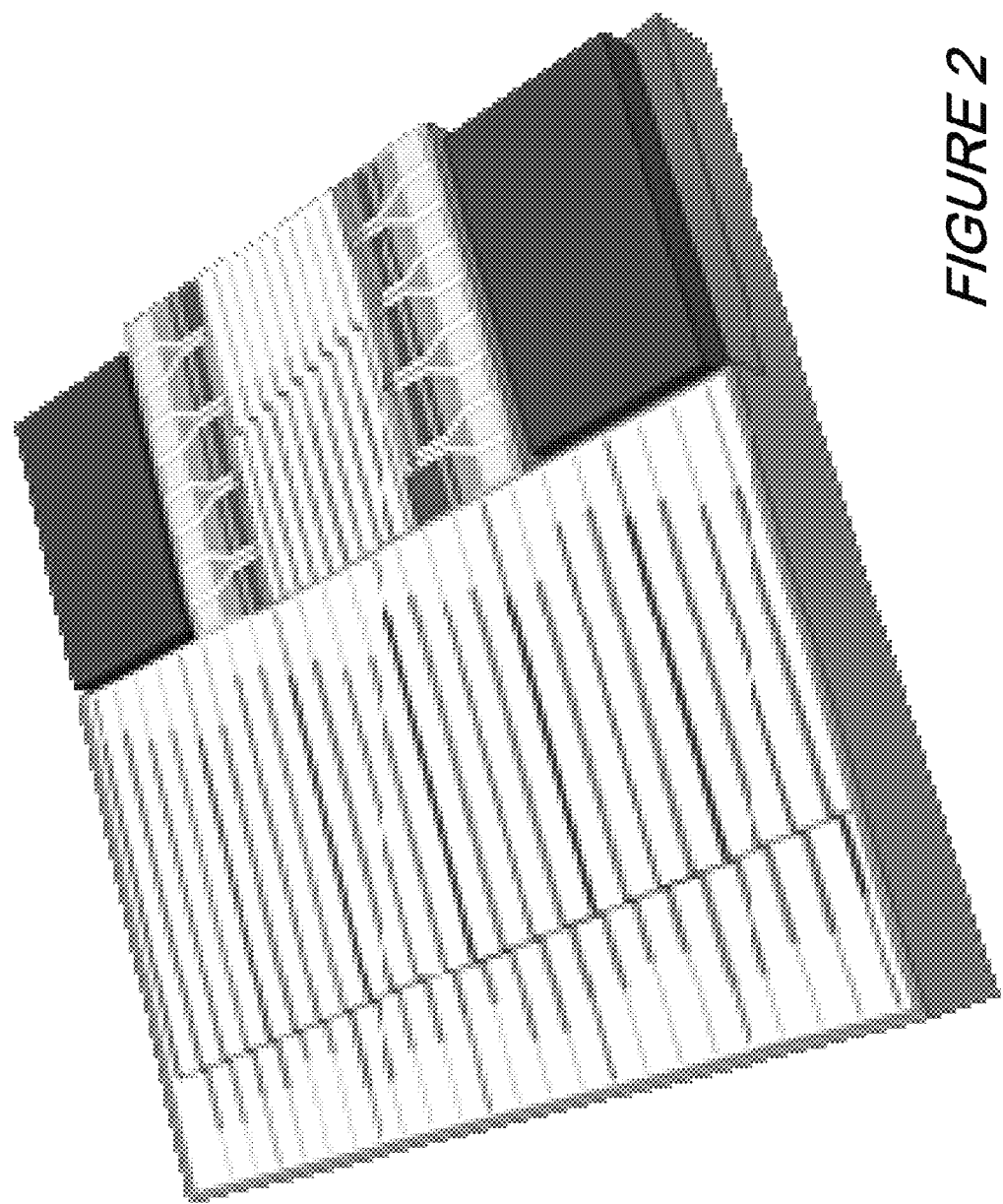
FIG. 2 shows a schematic illustration of the exemplary electronic chip to photonic chip integration of FIG. 1 after the electronic chips are positioned according to an aspect of the present disclosure.

FIG. 1 and FIG. 2 show a schematic diagram illustrating the integration of two electronics chip onto a photonic chip. As may be observed from that FIG. 1, two recessed windows are etched into the photonic chip. In the exemplary etching depicted in FIG. 1, the windows so etched are made near corners of the photonic chip and are made exhibiting a depth that substantially matches the thickness of electronic chips that are positioned therein/thereon along with the thickness of any joint and/or bonding material (i.e., epoxy, solder, etc.) FIG. 2 shows in schematic form the two electronic chips positioned upon/into the etched regions adjacent to the photonic chip.

Advantageously, and according to an aspect of the present disclosure, the etched, recessed window(s) may be metalized to provide electrical grounding, and the electronic chips may be positioned upside-up with wire bond connections to the photonic chip. Alternatively, pattern traces may be formed at the bottom of the recessed window(s), and the electronic chips positioned upside-down to complete any electrical connections.

Of further advantage, the recessed window(s) may be processed using a variety of micro-fabrication techniques. Examples of such techniques include plasma-based dry etch, wet-chemical etch, etc. As may be readily appreciated, such micro-fabrication of windows may be done after any fabrication processes for photonic chips—including metallization steps—are completed.

In an exemplary fabrication process, a mask material may be used to cover an entire wafer except those locations where windows are desired such that the rest of the wafer is protected during the processes. To make windows of different depths, the process for each depth may be repeated sequentially or combinations of processes may be used to obtain desired depths. Advantageously, the metallization of the bottom of the recessed windows can be done in one step using commonly used metallization processes, such as evaporation, sputtering, plating, etc. Finally, electrical connections to the metallization at the bottom of the windows can be done through either metallization over the sidewalls of the windows, or through wire bonds during the package assembly.

At this point, those skilled in the art will readily appreciate that while the methods, techniques and structures according to the present disclosure have been described with respect to particular implementations and/or embodiments, those skilled in the art will recognize that the disclosure is not so limited. In particular, embodiments according to the present disclosure may advantageously be integrated together onto a single substrate. Accordingly, the scope of the disclosure should only be limited by the claims appended hereto.

The invention claimed is:

1. A method of integrating an electronic chip onto a photonic chip comprising:
   recessing a window into a surface of the photonic chip, said window exhibiting a size and a thickness matching the electronic chip;
   positioning the electronic chip into the window such that a top surface of the electronic chip is substantially coplanar with a top surface of the photonic chip; and
   electrically connecting and mechanically securing the electronic chip to the photonic chip.

2. The method of claim 1 further comprising forming a metallization layer at a bottom of the window.

3. The method of claim 1, wherein:
   recessing a window into the surface of the photonic chip comprises etching the window into the surface of the photonic chip.

4. The method of claim 3, wherein electrically connecting the electronic chip to the photonic chip comprises placing a wire bond between the top surface of the electronic chip and the photonic chip.

5. The method of claim 4, wherein electrically connecting the electronic chip to the photonic chip comprises electrically connecting a bottom surface of the electronic chip opposite the top surface of the electronic chip to an adjacent surface of the window.

6. The method of claim 3, wherein electrically connecting the electronic chip to the photonic chip comprises electrically connecting a bottom surface of the electronic chip opposite the top surface of the electronic chip to an adjacent surface of the window.

7. The method of claim 3, wherein positioning the electronic chip into the window comprises positioning an edge of the electronic chip within 200 microns of a facing edge of the photonic chip.

8. The method of claim 3, wherein positioning the electronic chip into the window comprises positioning the electronic chip into the window when the photonic chip forms part of a photonic wafer.

9. The method of claim 3, wherein the window is a first window and the electronic chip is a first electronic chip, and wherein the method further comprises etching a second window into the surface of a photonic chip such that the first and second windows are separated by a plateau region of the photonic chip, the method further comprising positioning the second electronic chip into the second window.

10. The method of claim 3, wherein electrically connecting the electronic chip to the photonic chip comprises electrically grounding a surface of the electronic chip adjacent a bottom surface of the window.

11. The method of claim 3, further comprising forming a metal layer on a bottom surface of the window, and wherein electrically connecting the electronic chip to the photonic chip comprises electrically connecting the electronic chip to the metal layer.

12. The method of claim 3, further comprising forming conductive traces on a bottom surface of the window, and wherein electrically connecting the electronic chip to the photonic chip comprises electrically connecting the conductive traces to the electronic chip.

13. The method of claim 3, further comprising depositing metal over sidewalls of the window.

14. A method of integrating an electronic chip onto a photonic chip comprising the steps of:
    fabricating a window into the surface of the photonic chip, said window exhibiting a size and a thickness matching the electronic chip;
    forming electrical wire traces at the bottom of the window such that the photonic chip and the electronic chip are electrically connected when the electronic chip is positioned into the window and mechanical contact to the electrical traces is made by such positioning;
    positioning the electronic chip into the window such that the top surface of the electronic chip is substantially coplanar with the top surface of the photonic chip; and
    electrically connecting and mechanically securing the electronic chip to the photonic chip.

15. The method of claim 14 wherein said electronic chip is positioned upside-down in the window.

16. The method of claim 14, wherein fabricating the window into the surface of the photonic chip comprises recessing the window into the surface of the photonic chip.

* * * * *